United States Patent
Chen et al.

(10) Patent No.: US 9,425,087 B1
(45) Date of Patent: Aug. 23, 2016

(54) METHOD FOR FORMING SEMICONDUCTOR DEVICE STRUCTURE

(71) Applicant: Taiwan Semiconductor Manufacturing Co., Ltd., Hsin-Chu (TW)

(72) Inventors: Wei-Ting Chen, Hsinchu (TW); Che-Cheng Chang, New Taipei (TW); Tai-Shin Cheng, Hsinchu (TW); Wei-Yin Shiao, Taichung (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 14/725,600

(22) Filed: May 29, 2015

(51) Int. Cl.
*H01L 21/4763* (2006.01)
*H01L 21/768* (2006.01)
*H01L 23/532* (2006.01)

(52) U.S. Cl.
CPC ... *H01L 21/76814* (2013.01); *H01L 21/76877* (2013.01); *H01L 23/53228* (2013.01)

(58) Field of Classification Search
CPC .................. H01L 21/76814; H01L 21/76877; H01L 23/53228; H01J 49/0031
USPC ........................................................ 438/637
See application file for complete search history.

(56) References Cited

U.S. PATENT DOCUMENTS

| | | | | |
|---|---|---|---|---|
| 6,017,826 A | * | 1/2000 | Zhou ................. | H01L 21/32136 216/67 |
| 6,037,262 A | * | 3/2000 | Hsia .................. | H01L 21/76808 257/E21.579 |
| 2006/0276005 A1 | * | 12/2006 | Yang ...................... | H01L 21/78 438/455 |
| 2006/0276006 A1 | * | 12/2006 | Yang ...................... | H01L 21/78 438/455 |
| 2007/0287277 A1 | * | 12/2007 | Kolics ............... | H01L 21/76829 438/597 |

* cited by examiner

*Primary Examiner* — David S Blum
(74) *Attorney, Agent, or Firm* — Birch, Stewart, Kolasch & Birch, LLP (57) ABSTRACT

A method for forming a semiconductor device structure is provided. The method includes forming a dielectric layer over a semiconductor substrate. The method includes forming a mask layer over the dielectric layer. The mask layer has an opening exposing a portion of the dielectric layer. The method includes removing the portion of the dielectric layer through the opening to form a recess in the dielectric layer. The method includes removing the mask layer. The method includes performing a plasma cleaning process over the dielectric layer. The plasma cleaning process uses a carbon dioxide-containing gas.

20 Claims, 8 Drawing Sheets

METHOD FOR FORMING SEMICONDUCTOR DEVICE STRUCTURE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1I are cross-sectional views of various stages of a process for forming a semiconductor device structure 100, in accordance with some embodiments.

Figure 1A:
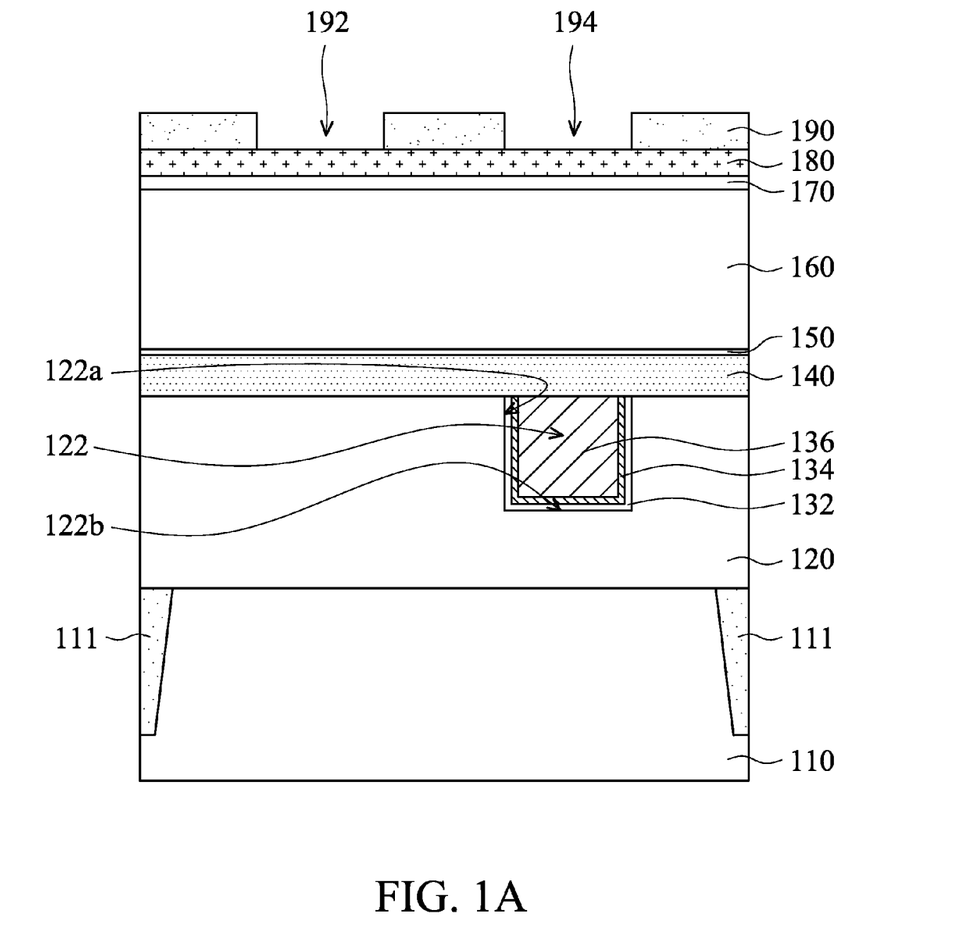
FIGS. 1A-1H are cross-sectional views of various stages of a process for forming a semiconductor device structure, in accordance with some embodiments.

As shown in FIG. 1A, a substrate 110 is provided, in accordance with some embodiments. The substrate 110 may be a semiconductor wafer such as a silicon wafer. Alternatively or additionally, the substrate 110 may include elementary semiconductor materials, compound semiconductor materials, and/or alloy semiconductor materials.

Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

As shown in FIG. 1A, an isolation structure 111 is formed in the semiconductor substrate 110, in accordance with some embodiments. The isolation structure 111 surrounds a device region of the semiconductor substrate 110, in accordance with some embodiments. The isolation structure 111 is configured to define and electrically isolate various device elements (not shown) formed in the semiconductor substrate 110, in accordance with some embodiments.

Examples of device elements may include, but are not limited to, transistors, diodes, and/or other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and/or other applicable processes.

As shown in FIG. 1A, a dielectric layer 120 is formed over the substrate 110 and the isolation structure 111, in accordance with some embodiments. The dielectric layer 120 includes dielectric materials, in accordance with some embodiments. Examples of the dielectric materials may include, but are not limited to, oxide, $SiO_2$, borophosphosilicate glass (BPSG), spin on glass (SOG), undoped silicate glass (USG), fluorinated silicate glass (FSG), high-density plasma (HDP) oxide, or plasma-enhanced TEOS (PE-TEOS).

The dielectric layer 120 may include multilayers made of multiple dielectric materials, such as a low dielectric constant or an extreme low dielectric constant (ELK) material. The dielectric layer 120 may be formed by chemical vapor deposition (CVD), physical vapor deposition (PVD), atomic layer deposition (ALD), spin-on coating, or another applicable process.

As shown in FIG. 1A, a trench 122 is formed in the dielectric layer 120, in accordance with some embodiments. The trench 122 is formed using a photolithography process and an etching process, in accordance with some embodiments. As shown in FIG. 1A, a barrier layer 132 is formed in the trench 122, in accordance with some embodiments. The barrier layer 132 conformally covers inner walls 122a and a bottom surface 122b of the trench 122, in accordance with some embodiments.

The barrier layer 132 is configured to prevent diffusion of metal materials formed in the trench 122 into the dielectric layer 120, in accordance with some embodiments. The barrier layer 132 includes tantalum or another suitable material. The barrier layer 132 is formed using a physical vapor deposition process, in accordance with some embodiments.

As shown in FIG. 1A, a seed layer 134 is formed over the barrier layer 132, in accordance with some embodiments. The seed layer 134 includes copper (Cu) and manganese (Mn) or other suitable materials. The seed layer 134 is formed using a physical vapor deposition process, in accordance with some embodiments. As shown in FIG. 1A, a conductive structure 136 is formed in the trench 122 and over the seed layer 134, in accordance with some embodiments. The conductive structure 136 includes a conductive line, in accordance with some embodiments. The conductive structure 136 includes aluminum (Al), copper (Cu), or another suitable material. The conductive structure 136 is formed using a plating process, in accordance with some embodiments.

As shown in FIG. 1A, a dielectric layer 140 is formed over the dielectric layer 120, the barrier layer 132, the seed layer 134, and the conductive structure 136, in accordance with some embodiments. The dielectric layer 140 is configured to prevent diffusion of metal materials of the conductive structure 136 into a dielectric layer formed thereover, in accordance with some embodiments.

The dielectric layer 140 includes dielectric materials, in accordance with some embodiments. The dielectric layer 140 includes silicon carbide, silicon nitride, or another suitable dielectric material. The dielectric layers 120 and 140 are made of different materials, in accordance with some embodiments. The dielectric layer 140 may include multilayers made of different dielectric materials. The dielectric layer 140 may be formed by chemical vapor deposition (CVD), physical vapor deposition (PVD), atomic layer deposition (ALD), spin-on coating, or another applicable process.

As shown in FIG. 1A, an adhesive layer 150 is formed over the dielectric layer 140, in accordance with some embodiments. The adhesive layer 150 is configured to adhere the dielectric layer 140 to another dielectric layer thereon. The adhesive layer 150 includes tetraethoxysilane (TEOS) or another suitable material. In some other embodiments, the adhesive layer 150 is not formed.

As shown in FIG. 1A, a dielectric layer 160 is formed over the adhesive layer 150, in accordance with some embodiments. The dielectric layer 160 covers the conductive structure 136, in accordance with some embodiments. The dielectric layers 160 and 140 are made of different materials so that the dielectric layers 160 and 140 can have etching selectivity in subsequent etching processes, in accordance with some embodiments. The dielectric layers 160 and 140 and the adhesive layer 150 are made of different materials, in accordance with some embodiments.

The dielectric layer 160 includes dielectric materials, in accordance with some embodiments. Examples of the dielectric materials may include, but are not limited to, oxide, $SiO_2$, borophosphosilicate glass (BPSG), spin on glass (SOG), undoped silicate glass (USG), fluorinated silicate glass (FSG), high-density plasma (HDP) oxide, or plasma-enhanced TEOS (PETEOS).

The dielectric layer 160 may include multilayers made of multiple dielectric materials, such as a low dielectric constant or an extreme low dielectric constant (ELK) material. The dielectric layer 160 may be formed by chemical vapor deposition (CVD), physical vapor deposition (PVD), atomic layer deposition (ALD), spin-on coating, or another applicable process.

As shown in FIG. 1A, an etching stop layer 170 is formed over the dielectric layer 160, in accordance with some embodiments. The etching stop layer 170 includes silicon nitride, silicon oxide, or another suitable material. The etching stop layer 170 is formed using a chemical vapor deposition process, in accordance with some embodiments.

As shown in FIG. 1A, a mask layer 180 is formed over the etching stop layer 170, in accordance with some embodiments. In some embodiments, the mask layer 180 includes oxide, such as silicon oxide. In some embodiments, the mask layer 180 includes silicon nitride, titanium nitride, polymer materials, other applicable materials, or a combination thereof. In some embodiments, the mask layer 180 is formed using a chemical vapor deposition process.

As shown in FIG. 1A, a hard mask layer 190 is formed over the mask layer 180, in accordance with some embodiments. The hard mask layer 190 has trenches 192 and 194, in accordance with some embodiments. The trenches 192 and 194 expose a portion of the mask layer 180, in accordance with some embodiments.

Examples of a material for the hard mask layer 190 include, but are not limited to, titanium nitride, silicon oxide, silicon nitride (e.g., $Si_3N_4$), SiON, SiC, SiOC, polymer materials, or a combination thereof. The hard mask layer 190 may be formed by chemical vapor deposition (CVD), physical vapor deposition (PVD), atomic layer deposition (ALD), spin-on coating, or another applicable process. In some embodiments, the mask layer 180 and the hard mask layer 190 are made of different materials so that the mask layer 180 and the hard mask layer 190 can have etching selectivity in subsequent etching processes.

Figure 1B:
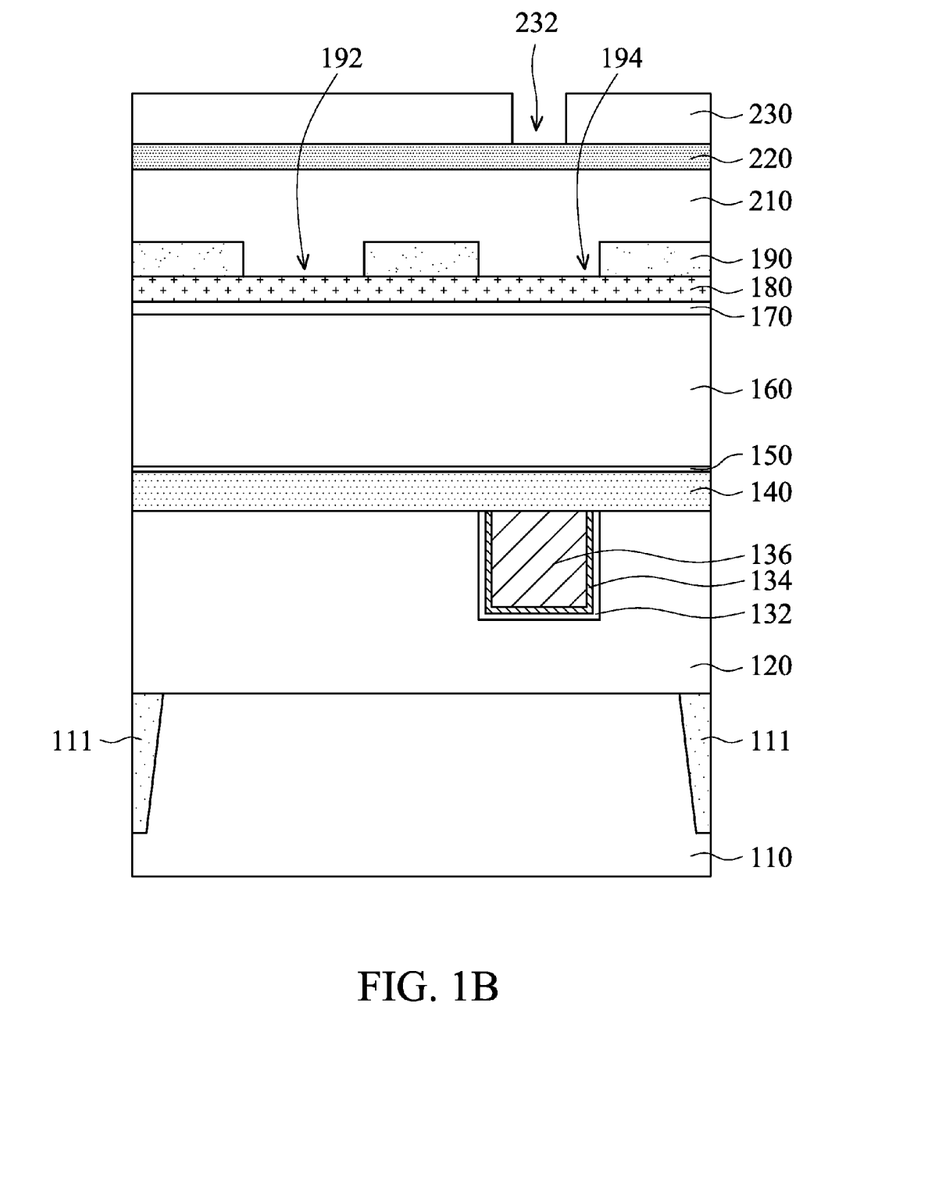

As shown in FIG. 1B, a cover layer 210 is formed over the hard mask layer 190 and filled into the trenches 192 and 194, in accordance with some embodiments. The cover layer 210 is made of a polymer material or another suitable material. The cover layer 210 is formed by a coating process, a CVD process, or another suitable process.

As shown in FIG. 1B, a middle layer 220 is formed over the cover layer 210, in accordance with some embodiments. In some embodiments, the middle layer 220 is made of a silicon-containing material (e.g., a silicon-containing polymer material). In some embodiments, the mask layer 180, the hard mask layer 190, the cover layer 210, and the middle layer 220 are made of different materials so that they can have etching selectivity in etching processes performed afterwards. The middle layer 220 is formed by a coating process, a CVD process, or another suitable process.

As shown in FIG. 1B, a photoresist layer 230 is formed over the middle layer 220, in accordance with some embodiments. The photoresist layer 230 has an opening 232 exposing a portion of the middle layer 220, in accordance with some embodiments. The photoresist layer 230 is made of a photoresist material, in accordance with some embodiments. The photoresist layer 230 is formed by, for example, a coating process and a photolithography process.

Figure 1C:
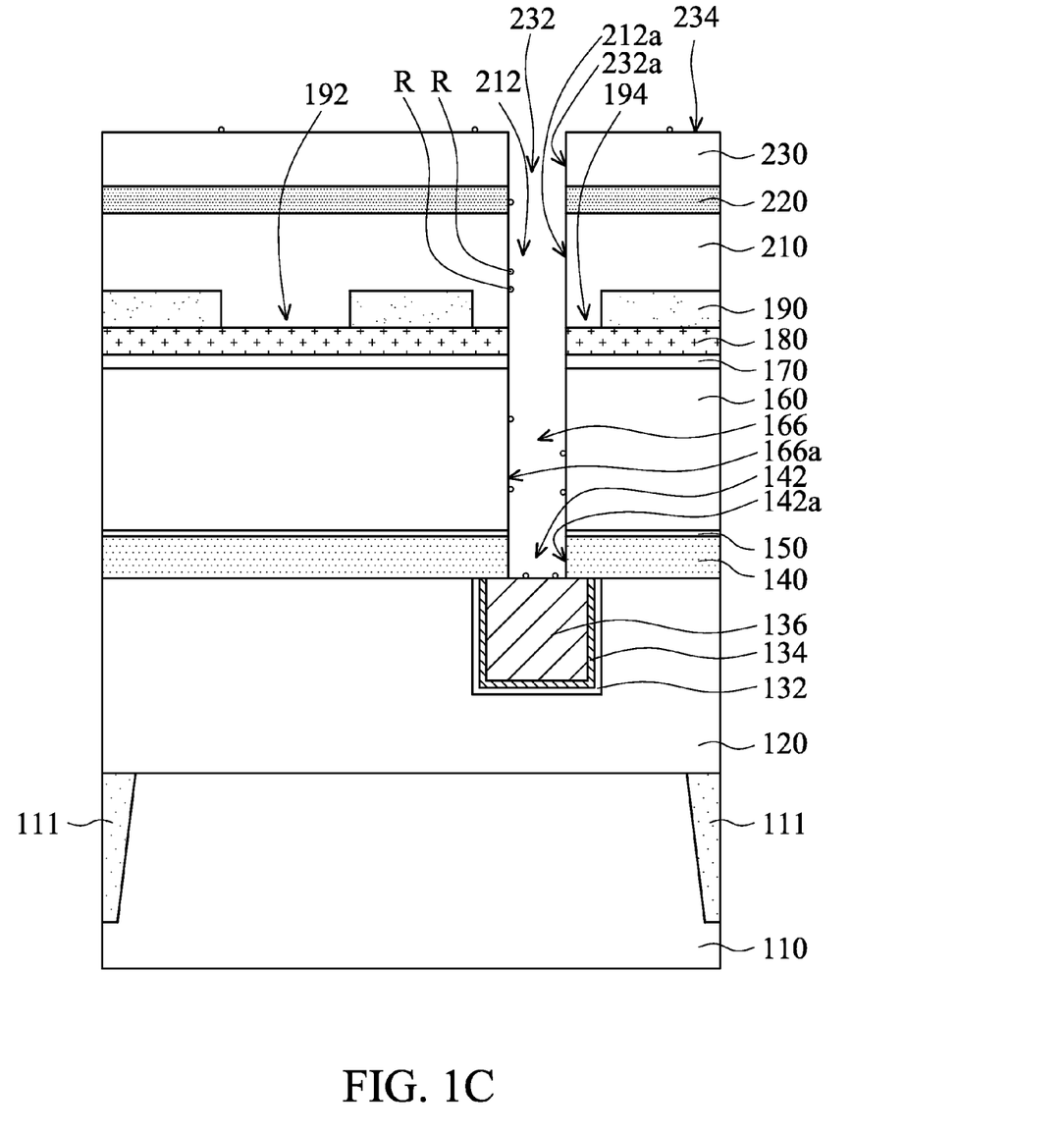

As shown in FIG. 1C, portions of the middle layer 220, the cover layer 210, the mask layer 180, the etching stop layer 170, the dielectric layer 160, the adhesive layer 150, and the dielectric layer 140 under the opening 232 are removed through the opening 232, in accordance with some embodiments.

After the removal process, an opening 212 passing through the middle layer 220, the cover layer 210, the mask layer 180, and the etching stop layer 170, a hole 166 passing through the dielectric layer 160 and the adhesive layer 150, and a through hole 142 passing through the dielectric layer 140 are formed, in accordance with some embodiments. The hole 166 is connected to the opening 212 and the through hole 142, in accordance with some embodiments. The through hole 142 exposes a portion of the conductive structure 136, in accordance with some embodiments.

The opening 212 is connected to the opening 232 and exposes the portion of the conductive structure 136, in accordance with some embodiments. The opening 212 passes through the trench 194, in accordance with some embodiments. The removal process includes a dry etching process, in accordance with some embodiments.

In some embodiments, residues R are formed over inner walls 212a, 232a, 166a, and 142a of the openings 212 and 232, the hole 166, and the through hole 142 and a top surface 234 of the photoresist layer 230. In some embodiments, the residues R are formed over the conductive structure 136 exposed by the through hole 142. The residues R are formed from the cover layer 210, the middle layer 220, and/or the photoresist layer 230, in accordance with some embodiments.

The cover layer 210, the middle layer 220, and/or the photoresist layer 230 include(s) organic materials, and the residues R include the organic materials as well, in accordance with some embodiments. Therefore, the residues R include carbon, in accordance with some embodiments.

Figure 1D:
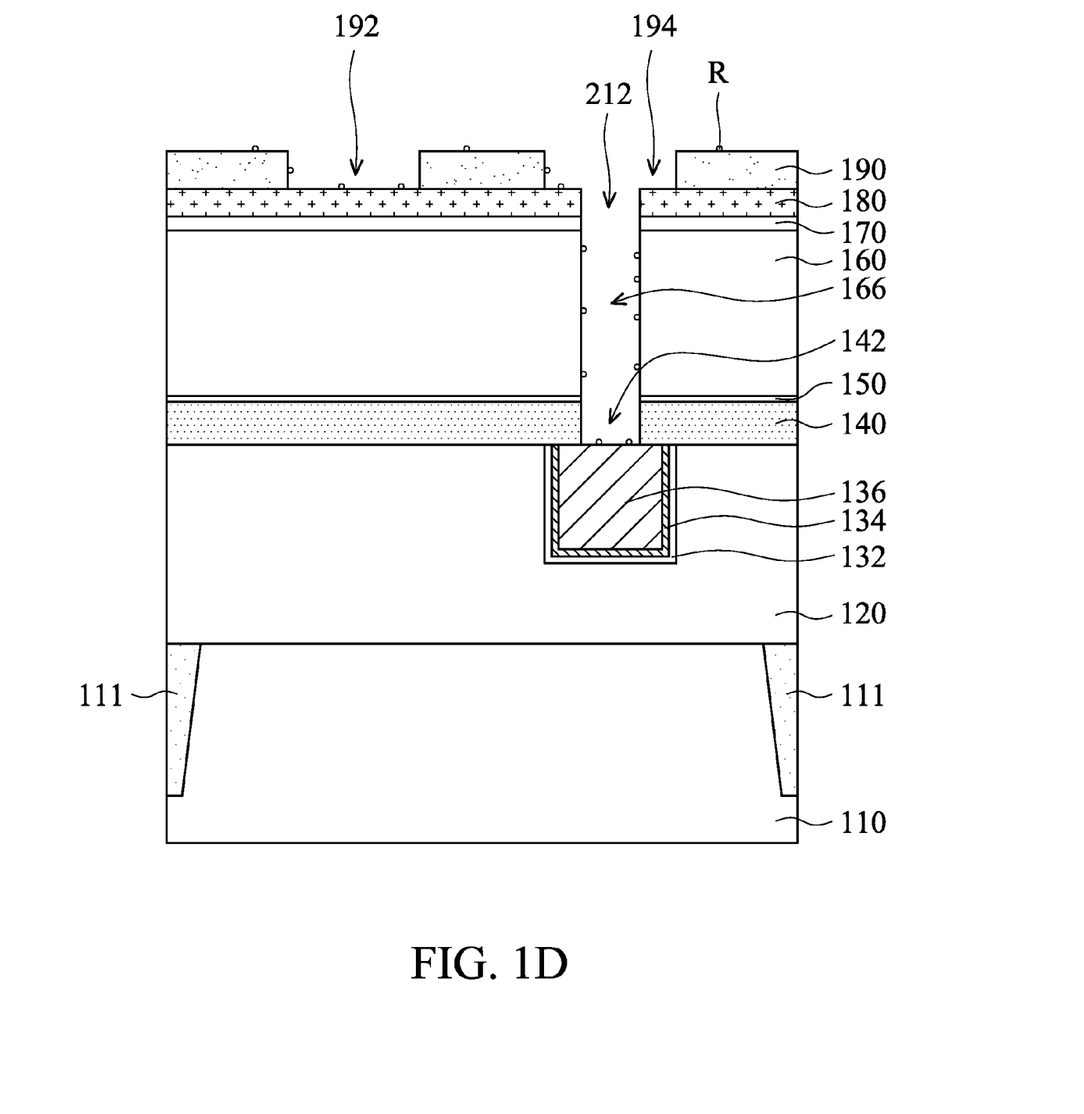

As shown in FIG. 1D, the cover layer 210, the middle layer 220, and the photoresist layer 230 are removed, in accordance with some embodiments. The removal process includes a dry etching process or a wet etching process, in accordance with some embodiments. The dry etching process includes an ashing process, in accordance with some embodiments. After the removal process, the residues R may be further formed over the mask layer 180 and the hard mask layer 190.

Figure 1E:
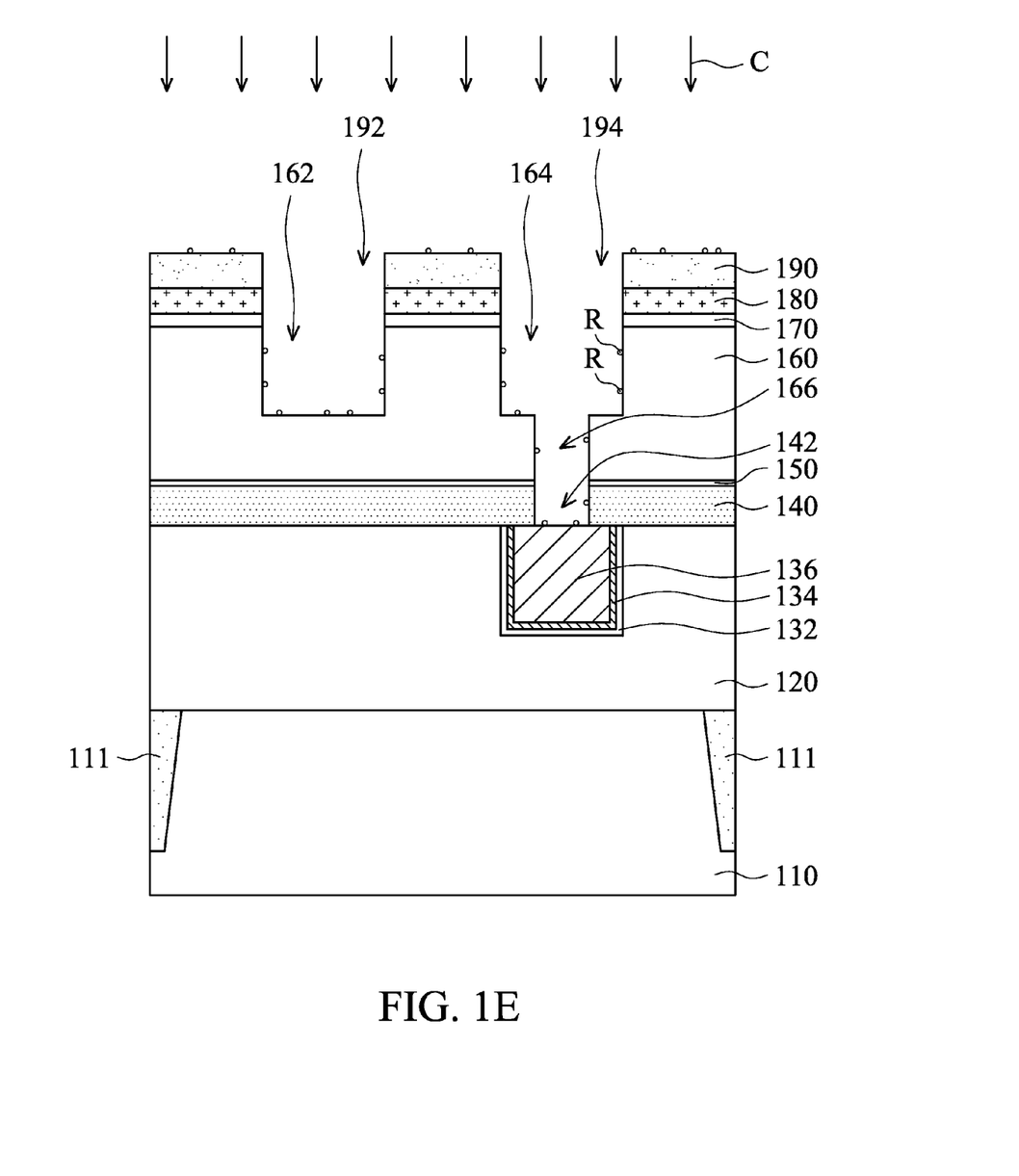

As shown in FIG. 1E, an etching process is performed to remove portions of the mask layer 180, the etching stop layer 170, the dielectric layer 160 under the trenches 192 and 194, in accordance with some embodiments. After the etching process, trenches 162 and 164 are formed in the dielectric layer 160, in accordance with some embodiments. The hole 166 is connected to the trench 164 and the through hole 142, in accordance with some embodiments. The trenches 162 and 164, the hole 166, and the through hole 142 are also referred to as recesses, in accordance with some embodiments.

The etching process includes a dry etching process, in accordance with some embodiments. The dry etching process includes a plasma etching process, in accordance with some embodiments. The plasma etching process uses a carbon-containing gas, in accordance with some embodiments. The carbon-containing gas includes methane ($CH_4$), octafluorocyclobutane ($C_4F_8$), ethyne ($C_2H_2$), or another suitable gas.

In some embodiments, during the plasma etching process, some of the organic monomer molecules contained in the carbon-containing gas are undesirably polymerized to form residues R over the hard mask layer 190 and in the trenches 162 and 164, the hole 166, and the through hole 142. The residues R include carbon, in accordance with some embodiments. In some embodiments, after the plasma etching process, a portion of the mask layer 180 forms the residues R.

Figure 1F:
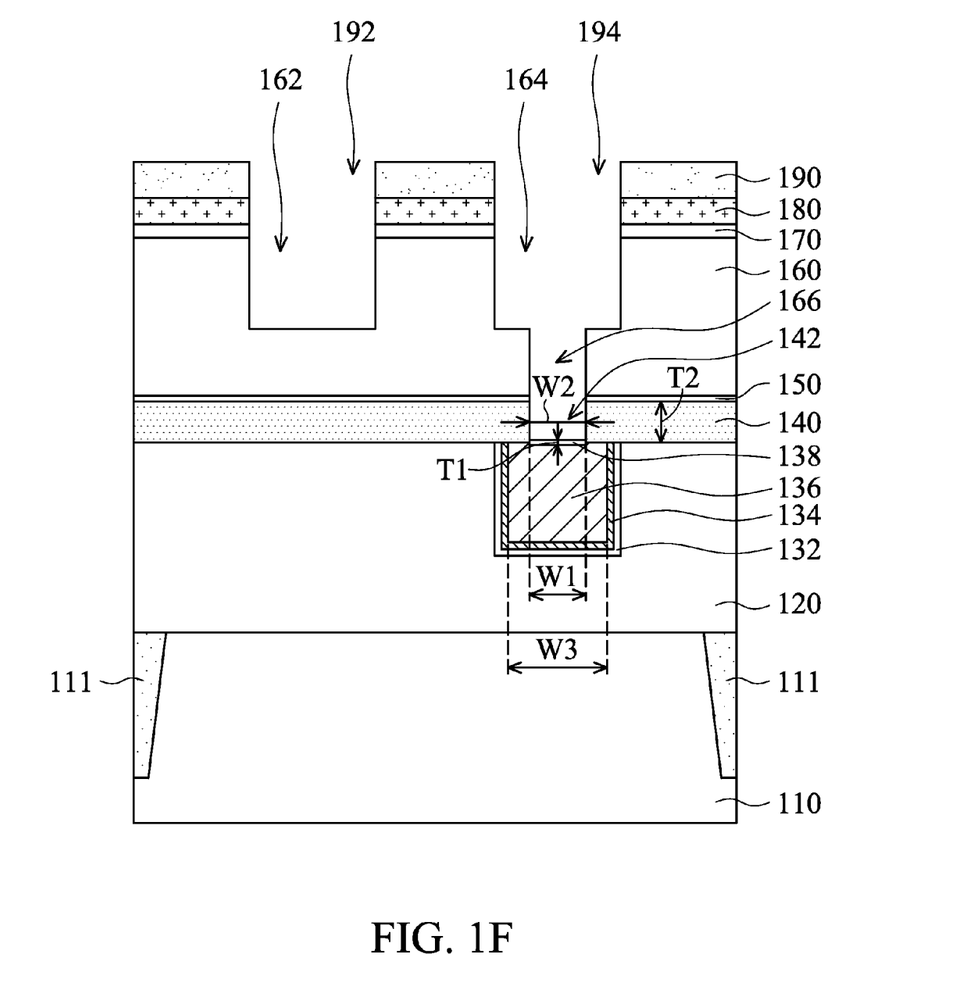

As shown in FIGS. 1E and 1F, after the plasma etching process, a plasma cleaning process C is performed over the conductive structure 136, the dielectric layer 140, the adhesive layer 150, the dielectric layer 160, the etching stop layer 170, the mask layer 180, and the hard mask layer 190, in accordance with some embodiments. The plasma cleaning process C is configured to clean the residues R, in accordance with some embodiments. The plasma cleaning process C uses a carbon dioxide-containing gas, in accordance with some embodiments.

The plasma cleaning process C using the carbon dioxide-containing gas is able to effectively oxidize and remove the residues R, in accordance with some embodiments. The residue removal ability of the carbon dioxide plasma is better than that of the argon plasma, in accordance with some embodiments. In some embodiments, the carbon dioxide-containing gas includes pure carbon dioxide. In some other embodiments, the carbon dioxide-containing gas includes a mixture of carbon dioxide and other suitable gases.

The plasma cleaning process C is performed under a pressure ranging from about 2 mTorr to about 30 mTorr and using power ranging from about 400 W to about 1000 W, in accordance with some embodiments. The plasma cleaning process C is performed using a bias power ranging from about 0.01 W to about 300 W, in accordance with some embodiments.

As shown in FIG. 1F, the plasma cleaning process C forms a metal oxide layer 138 over the conductive structure 136, in accordance with some embodiments. In some embodiments, the conductive structure 136 exposed by the through hole 142 is oxidized to form the metal oxide layer 138 by the plasma cleaning process C. Therefore, the conductive structure 136 and the metal oxide layer 138 have the same metal element, such as copper, tungsten, or aluminum. The metal oxide layer 138 includes copper oxide, tungsten trioxide, or aluminum oxide, or another suitable metal oxide.

Thereafter, a wet cleaning process is performed over the metal oxide layer 138, the dielectric layer 140, the adhesive layer 150, the dielectric layer 160, the etching stop layer 170, the mask layer 180, and the hard mask layer 190, in accordance with some embodiments. The cleaning process uses a cleaning solution including an ozone in deionized water ($O_3$/DI) cleaning solution or a SPM cleaning solution, in accordance with some embodiments. The SPM cleaning solution includes a mixture of sulfuric acid, a hydrogen peroxide solution, and pure water, in accordance with some embodiments.

During the wet cleaning process, the metal oxide layer 138 prevents the conductive structure 136 from being damaged (or removed) by the cleaning solution. Therefore, the electrical properties of the conductive structure 136 is improved. In some embodiments, a portion of the metal oxide layer 138 is removed by the wet cleaning process. In some other embodiments (not shown), the entire metal oxide layer 138 is removed by the wet cleaning process.

In some embodiments, a thickness T1 of the metal oxide layer 138 ranges from about 10 Å to about 50 Å. In some embodiments, the thickness T1 of the metal oxide layer 138 is less than a thickness T2 of the dielectric layer 140. In some embodiments, since the metal oxide layer 138 is formed by oxidizing the conductive structure 136 exposed by the through hole 142, a width W1 of the metal oxide layer 138 is substantially equal to a width W2 of the through hole 142.

The width W1 ranges from about 20 Å to about 100 Å, in accordance with some embodiments. The width W2 ranges from about 20 Å to about 100 Å, in accordance with some embodiments. In some embodiments, the width W1 of the metal oxide layer 138 is less than a width W3 of the conductive structure 136. The width W3 is also referred to as a line width, in accordance with some embodiments.

Figure 1G:
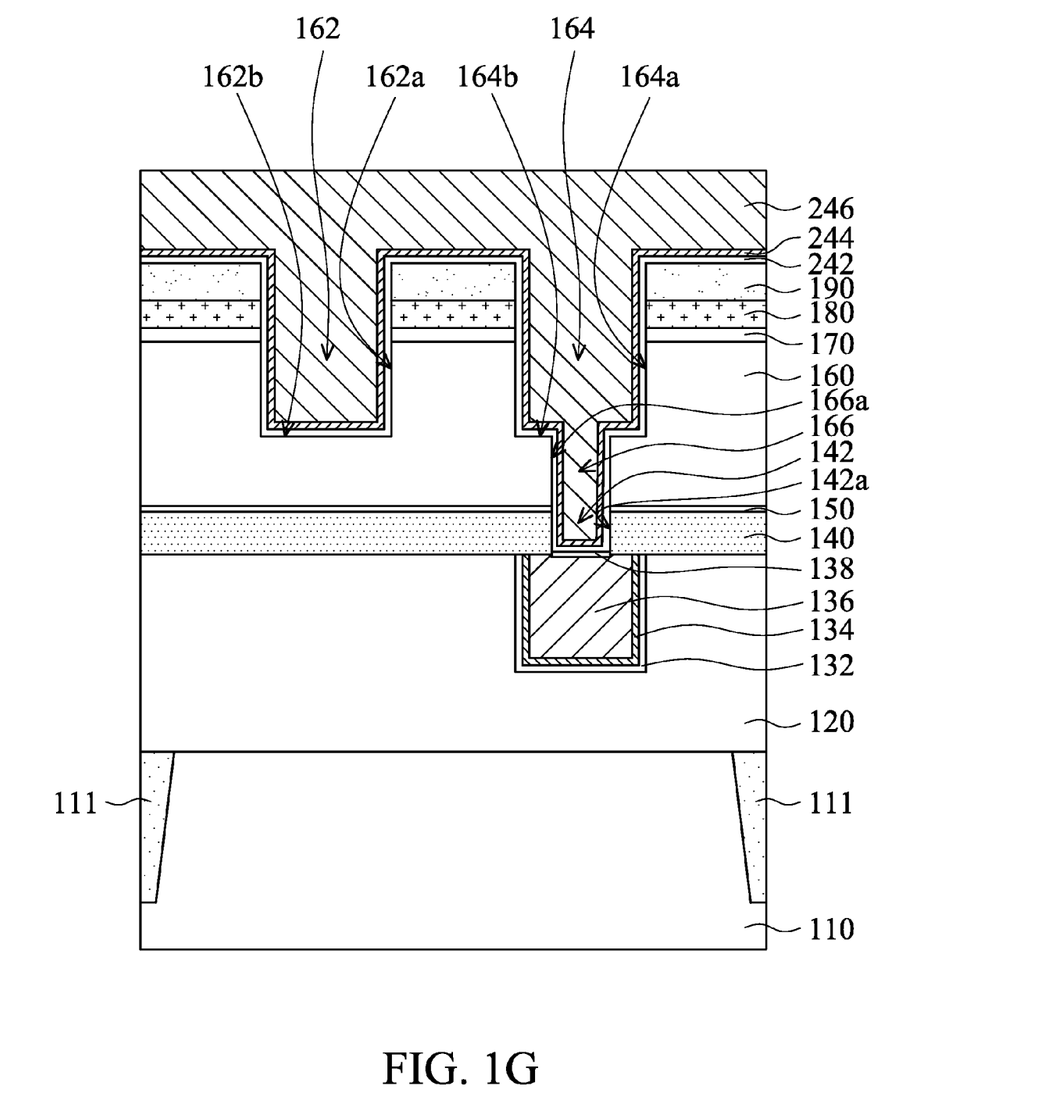

As shown in FIG. 1G, a barrier layer 242 is formed in the trenches 162 and 164, the hole 166, and the through hole 142, in accordance with some embodiments. The barrier layer 242 conformally covers the inner walls 162*a*, 164*a*, 166*a*, and 142*a* of the trenches 162 and 164, the hole 166, and the through hole 142 and bottom surfaces 162*b* and 164*b* of the trenches 162 and 164, in accordance with some embodiments.

The barrier layer 242 is configured to prevent diffusion of metal materials formed in the trenches 162 and 164, the hole 166, and the through hole 142 into the dielectric layers 140 and 160 and the adhesive layer 150, in accordance with some embodiments. The barrier layer 242 includes tantalum or another suitable material. The barrier layer 242 is formed using a physical vapor deposition process, in accordance with some embodiments.

As shown in FIG. 1G, a seed layer 244 is formed over the barrier layer 242, in accordance with some embodiments. The seed layer 244 includes copper (Cu) and manganese (Mn) or other suitable materials. The seed layer 244 is formed using a physical vapor deposition process, in accordance with some embodiments.

As shown in FIG. 1G, a conductive layer 246 is formed in the trenches 162 and 164, the hole 166, and the through hole 142 and over the seed layer 244, in accordance with some embodiments. The conductive layer 246 includes aluminum (Al), copper (Cu), or another suitable material. The conductive layer 246 is formed using a plating process, in accordance with some embodiments.

Figure 1H:
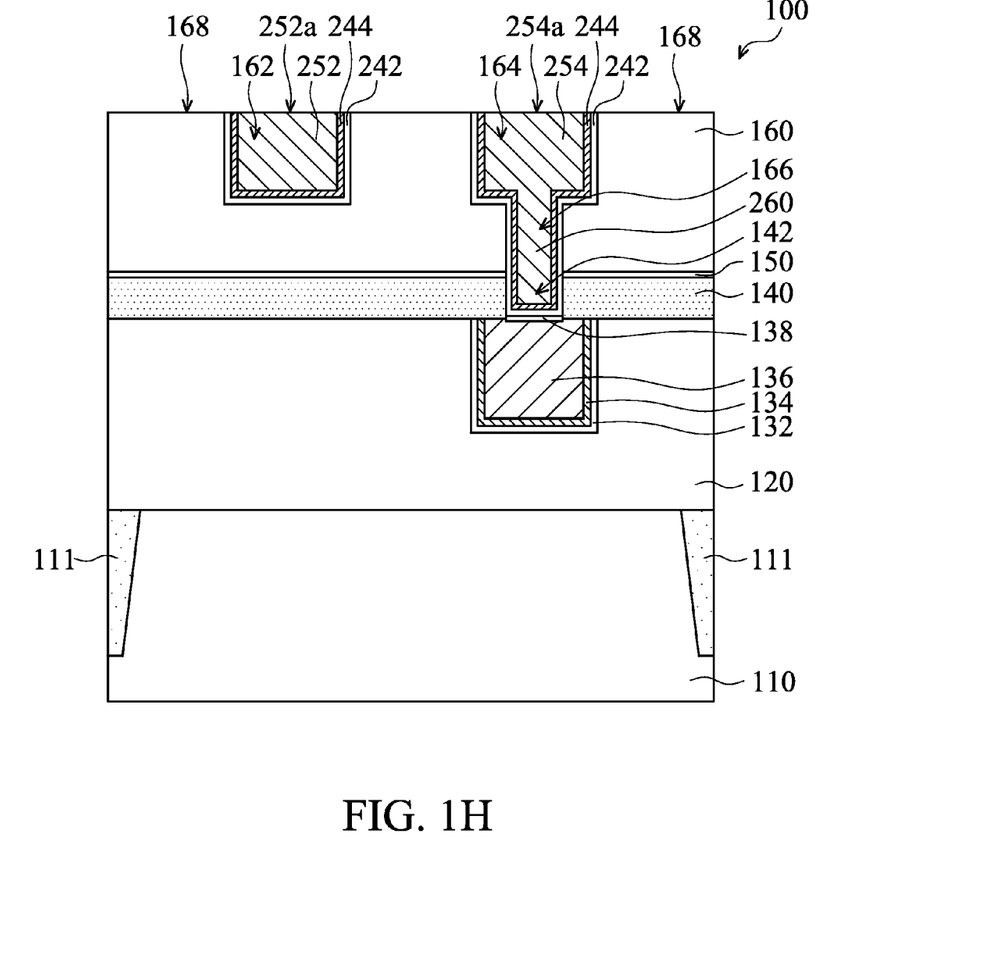

As shown in FIG. 1H, the barrier layer 242, the seed layer 244, and the conductive layer 246 outside of the trenches 162 and 164, the hole 166, and the through hole 142, the mask layer 180, and the hard mask layer 190 are removed, in accordance with some embodiments. The removal process includes a planarization process, such as a chemical mechanical polishing process, in accordance with some embodiments.

The conductive layer 246 remaining in the trench 162 forms a conductive structure 252, in accordance with some embodiments. The conductive structure 252 includes a conductive line, in accordance with some embodiments. The conductive layer 246 remaining in the trench 164 forms a conductive structure 254, in accordance with some embodiments. The conductive structure 254 includes a conductive line, in accordance with some embodiments.

In some embodiments, the top surface 252*a* of the conductive structure 252, the top surface 254*a* of the conductive structure 254, and the top surface 168 of the dielectric layer 160 are coplanar with each other. The conductive layer 246 remaining in the hole 166 and the through hole 142 forms a conductive structure 260, in accordance with some embodiments. The conductive structure 260 includes a conductive via structure, in accordance with some embodiments.

The conductive structure 260 passes through the dielectric layer 140 and penetrates into the dielectric layer 160, in accordance with some embodiments. The conductive structure 260 further passes through the adhesive layer 150 between the dielectric layers 140 and 160, in accordance with some embodiments.

The conductive structure 254 is in the dielectric layer 160 and over the conductive structure 260, in accordance with some embodiments. The conductive structure 136 is under the conductive structure 260 and electrically connected to the conductive structure 260, in accordance with some embodiments. In some embodiments, the conductive structures 252, 254, 136, and/or 260 include(s) conductive lines, conductive via structures, gates, other suitable conductive structures.

The metal oxide layer 138 is positioned between the conductive structure 136 and the conductive structure 260, in accordance with some embodiments. The metal oxide layer 138 is in direct contact with the conductive structure 136, in accordance with some embodiments. In some other embodiments, the metal oxide layer 138 is not formed.

In this step, a semiconductor device structure 100 is substantially formed. Since the plasma cleaning process C removes the residues R (as shown in FIG. 1E), the electrical properties and yield of the semiconductor device structure 100 is improved.

In accordance with some embodiments, methods for forming semiconductor device structures are provided. The methods (for forming the semiconductor device structures) form a recess in a dielectric layer using a mask layer and an etching process and perform a plasma cleaning process, using a carbon dioxide-containing gas, over the dielectric layer. The plasma cleaning process is able to effectively remove residues formed from the mask layer, which improves the electrical properties and yield of the semiconductor device structures formed by the methods.

In accordance with some embodiments, a method for forming a semiconductor device structure is provided. The method includes forming a dielectric layer over a semiconductor substrate. The method includes forming a mask layer over the dielectric layer. The mask layer has an opening exposing a portion of the dielectric layer. The method includes removing the portion of the dielectric layer through the opening to form a recess in the dielectric layer. The method includes removing the mask layer. The method includes performing a plasma cleaning process over the dielectric layer. The plasma cleaning process uses a carbon dioxide-containing gas.

In accordance with some embodiments, a method for forming a semiconductor device structure is provided. The method includes forming a first conductive structure over a semiconductor substrate. The method includes forming a dielectric layer over the semiconductor substrate and covering the first conductive structure. The method includes forming a mask layer over the dielectric layer. The mask layer has an opening exposing a portion of the dielectric layer. The method includes removing the portion of the dielectric layer to form a recess in the dielectric layer. The recess exposes the first conductive structure. The method includes removing the mask layer. The method includes performing a plasma cleaning process over the dielectric layer and the first conductive structure to form a metal oxide layer over the first conductive structure. The plasma cleaning process uses a carbon dioxide-containing gas.

In accordance with some embodiments, a method for forming a semiconductor device structure is provided. The method includes forming a dielectric layer over a semiconductor substrate. The method includes forming a polymer mask layer over the dielectric layer. The polymer mask layer has an opening exposing a portion of the dielectric layer. The method includes removing the portion of the dielectric layer to form a recess in the dielectric layer. The method includes removing the polymer mask layer. The method includes performing a plasma cleaning process over the dielectric layer, wherein the plasma cleaning process uses a carbon dioxide-containing gas.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a dielectric layer over a semiconductor substrate;
    forming a mask layer over the dielectric layer, wherein the mask layer has an opening exposing a portion of the dielectric layer;
    removing the portion of the dielectric layer through the opening to form a recess in the dielectric layer;
    removing the mask layer; and
    after removal of the mask layer, performing a plasma cleaning process over the dielectric layer, wherein the plasma cleaning process uses a carbon dioxide-containing gas.

2. The method for forming a semiconductor device structure as claimed in claim 1, wherein the mask layer comprises an organic material.

3. The method for forming a semiconductor device structure as claimed in claim 1, wherein the removal of the portion of the dielectric layer comprises:
    performing a plasma etching process.

4. The method for forming a semiconductor device structure as claimed in claim 3, wherein the plasma etching process uses a carbon-containing gas.

5. The method for forming a semiconductor device structure as claimed in claim 4, wherein the carbon-containing gas comprises methane, octafluorocyclobutane, or ethyne.

6. The method for forming a semiconductor device structure as claimed in claim 1, wherein the plasma cleaning process removes residues, which are formed from the mask layer, and the residues comprises carbon.

7. The method for forming a semiconductor device structure as claimed in claim 1, further comprising:
    after the plasma cleaning process, performing a wet cleaning process over the dielectric layer.

8. The method for forming a semiconductor device structure as claimed in claim 1, further comprising:
    after the plasma cleaning process, forming a conductive structure in the recess.

9. A method for forming a semiconductor device structure, comprising:
    forming a first conductive structure over a semiconductor substrate;
    forming a dielectric layer over the semiconductor substrate and covering the first conductive structure;
    forming a mask layer over the dielectric layer, wherein the mask layer has an opening exposing a portion of the dielectric layer;
    removing the portion of the dielectric layer to form a recess in the dielectric layer, wherein the recess exposes the first conductive structure;
    removing the mask layer; and
    performing a plasma cleaning process over the dielectric layer and the first conductive structure to form a metal oxide layer over the first conductive structure, wherein the plasma cleaning process uses a carbon dioxide-containing gas.

10. The method for forming a semiconductor device structure as claimed in claim 9, wherein a first width of the metal oxide layer is substantially equal to a second width of the recess.

11. The method for forming a semiconductor device structure as claimed in claim 9, wherein the first conductive structure and the metal oxide layer have a same metal element.

12. The method for forming a semiconductor device structure as claimed in claim 9, further comprising:
    after the plasma cleaning process, performing a wet cleaning process over the dielectric layer and the metal oxide layer.

13. The method for forming a semiconductor device structure as claimed in claim 12, wherein the wet cleaning process removes a portion of the metal oxide layer.

14. The method for forming a semiconductor device structure as claimed in claim 9, further comprising:
    after the plasma cleaning process, forming a second conductive structure in the recess, wherein the second conductive structure is electrically connected to the first conductive structure.

15. The method for forming a semiconductor device structure as claimed in claim 9, wherein a first thickness of the metal oxide layer is less than a second thickness of the dielectric layer.

16. A method for forming a semiconductor device structure, comprising:
    forming a dielectric layer over a semiconductor substrate;
    forming a polymer mask layer over the dielectric layer, wherein the polymer mask layer has an opening exposing a portion of the dielectric layer;
    removing the portion of the dielectric layer to form a recess in the dielectric layer;
    removing the polymer mask layer; and
    after removal of the polymer mask layer, performing a plasma cleaning process over the dielectric layer, wherein the plasma cleaning process uses a carbon dioxide-containing gas.

17. The method for forming a semiconductor device structure as claimed in claim 16, further comprising:
    before the formation of the dielectric layer, forming a conductive structure over the semiconductor substrate, the dielectric layer covers the conductive structure, the recess exposes the conductive structure, and the plasma cleaning process forms a metal oxide layer over the conductive structure exposed by the recess.

18. The method for forming a semiconductor device structure as claimed in claim 17, wherein the conductive structure comprises copper, and the metal oxide layer comprises copper oxide.

19. The method for forming a semiconductor device structure as claimed in claim 17, further comprising:
    after the plasma cleaning process, performing a wet cleaning process over the dielectric layer and the metal oxide layer.

20. The method for forming a semiconductor device structure as claimed in claim 17, wherein a first width of the metal oxide layer is less than a second width of the conductive structure.

* * * * *